United States Patent
Legendre et al.

(10) Patent No.: US 11,910,729 B2
(45) Date of Patent: Feb. 20, 2024

(54) SUPERCONDUCTING CURRENT LIMITER WITH ELECTROCONDUCTIVE SPACER

(71) Applicants: Supergrid Institute, Villeurbanne (FR); Institut Polytechnique De Grenoble, Grenoble (FR)

(72) Inventors: Pierre Legendre, Lyons (FR); Pascal Tixador, Lyons (FR)

(73) Assignees: Supergrid Institute, Villeurbanne (FR); Institut Polytechnique De Grenoble, Grenoble (FR)

( * ) Notice: Subject to any disclaimer, the term of this patent is extended or adjusted under 35 U.S.C. 154(b) by 693 days.

(21) Appl. No.: 17/055,929

(22) PCT Filed: May 16, 2019

(86) PCT No.: PCT/EP2019/062660
§ 371 (c)(1),
(2) Date: Nov. 16, 2020

(87) PCT Pub. No.: WO2019/219835
PCT Pub. Date: Nov. 21, 2019

(65) Prior Publication Data
US 2021/0184097 A1    Jun. 17, 2021

(30) Foreign Application Priority Data
May 17, 2018   (FR) ........................ 1854132

(51) Int. Cl.
*H10N 60/30* (2023.01)
*H01F 6/06* (2006.01)
(Continued)

(52) U.S. Cl.
CPC .............. *H10N 60/30* (2023.02); *H01F 6/06* (2013.01); *H02H 9/023* (2013.01); *H01F 2006/001* (2013.01)

(58) Field of Classification Search
CPC ..... H10N 60/30; H01F 6/06; H01F 2006/001; H02H 9/023; Y02E 40/60
(Continued)

(56) References Cited

U.S. PATENT DOCUMENTS

| 4,189,693 A | 2/1980 | Satti |
| 2008/0070788 A1* | 3/2008 | Kramer .................. H10N 60/30 257/43 |

(Continued)

FOREIGN PATENT DOCUMENTS

| EP | 0503448 A2 | 9/1992 |
| EP | 0935261 A2 | 8/1999 |

(Continued)

OTHER PUBLICATIONS

Machine translation of Yoneda et al. JP 2000197263 A Jul. 14, 2000 (Year: 2000).*

*Primary Examiner* — Kevin J Comber
(74) *Attorney, Agent, or Firm* — GableGotwals

(57) ABSTRACT

A superconducting current limiter having at least one superconducting conductor (3) wound so as to form a coil (2) extending in a single plane and connecting a first electrical connection terminal to a second electrical connection terminal, an electrically insulating spacer (8) being arranged between two turns of the coil. The superconducting conductor (3) consists of at least two separate superconducting cables (5) wound in parallel and whose ends are electrically connected by the first electrical connection terminal and by the second electrical connection terminal, respectively. An electrically conductive spacer (12) is arranged between two of said separate superconducting cables (5), this electrically conductive spacer (12) being able to be traversed by a cooling fluid.

18 Claims, 7 Drawing Sheets

(51) Int. Cl.
*H02H 9/02* (2006.01)
*H01F 6/00* (2006.01)

(58) Field of Classification Search
USPC .......................................................... 361/19
See application file for complete search history.

(56) References Cited

U.S. PATENT DOCUMENTS

2009/0270261 A1* 10/2009 Usoskin ................ H10N 60/30
 505/150
2009/0286685 A1* 11/2009 Kramer .................... H01F 6/06
 336/206

FOREIGN PATENT DOCUMENTS

| | | |
|---|---|---|
| EP | 1797599 B1 | 5/2009 |
| EP | 2117056 A1 | 11/2009 |
| EP | 2041809 B1 | 7/2010 |
| EP | 2289077 B1 | 11/2011 |
| JP | 2000197263 A * | 7/2000 |
| JP | 2000197263 A | 7/2000 |
| KR | 1020090034974 A | 4/2009 |
| WO | WO 2008006689 A1 | 1/2008 |

* cited by examiner

SUPERCONDUCTING CURRENT LIMITER WITH ELECTROCONDUCTIVE SPACER

CROSS-REFERENCE TO RELATED APPLICATIONS

This United States application is the National Phase of PCT Application No. PCT/EP2019/062660 filed 16 May 2019, which claims priority to French Patent Application No. 1854132 filed 17 May 2018, each of which is incorporated herein by reference.

The invention relates to the field of superconducting current limiters intended for high-voltage applications.

These current limiters, which may be resistive, consist of one or more superconducting conductors and have very low resistance during normal operation. When an electrical fault results in a high increase in the current density in the conductor or conductors, or when these are not sufficiently cooled, they lose their superconducting properties, and the current limiter then becomes highly resistive, thus keeping the current below a certain value.

The length of superconducting conductors required by the current limiter is proportional to the voltage of the network or device to be protected. It reaches several hundreds of meters, or even kilometers, for a current limiter intended for high voltages. Current limiters are therefore preferably wound compactly in order to limit the bulk of such a device, but this may nevertheless reach several meters in diameter. The windings of superconducting conductors form compact coils for which insulation problems occur.

Patent applications EP0503448 and EP0935261 describe a current limiter having a superconducting conductor wound substantially in the form of a spiral so as to form a bifilar coil extending in a single plane.

Patent application EP2041809 describes a resistive superconducting current limiter device, comprising a bifilar coil winding consisting of a strip-shaped conductor and electrically insulating spacers arranged between two turns of the winding, the spacer being able to be traversed by a refrigerant fluid.

Patent application EP1797599 describes a resistive superconducting current limiter device having a bifilar coil in which a space, into which a cooling fluid is able to pass, is maintained between two turns of the coil. This space is maintained by virtue of electrically insulating spacers that are adhesively bonded to the superconducting strips.

Patent application EP2289077 describes a resistive superconducting current limiter device having a bifilar coil consisting of a plurality of superconducting strips. In some of its embodiments, this document describes an insulating spacer able to be traversed by a cooling fluid and arranged between two turns that are at the same electrical potential.

The aim of the invention is to improve the current limiters from the prior art by proposing an arrangement of the superconducting conductors that allows the current limiter to handle high currents, while providing high-performance cooling of the current limiter, and to do so for voltages of the order of 50 to 2000 kV and nominal currents of the order of 1000 A to 10000 A.

To this end, the invention targets a superconducting current limiter having at least one superconducting conductor wound so as to form a coil extending in a single plane and connecting a first electrical connection terminal to a second electrical connection terminal, an electrically insulating spacer being arranged between two turns of the coil. The superconducting conductor consists of at least two separate superconducting cables wound in parallel and whose ends are electrically connected by the first electrical connection terminal and by the second electrical connection terminal, respectively. An electrically conductive spacer is arranged between two of said separate superconducting cables, this electrically conductive spacer being able to be traversed by a cooling fluid.

A superconducting cable is a conductive wire that may have any cross section, for example a round, oval or rectangular cross section, formed at least partially of a superconducting material. It may consist of a core covered with a superconducting coating. It may advantageously consist, at least partly, of one of the following materials:

materials called "REBCO" (rare earth barium copper oxides): $REBa_2Cu_3O_{7+x}$, where RE represents one or more elements from among Y and rare earths (Gd, Nd, Dy, Eu, etc.);

$MgB_2$;

$Bi_2Sr_2Ca_2Cu_3O_{10+x}$;

any other superconducting material suitable for the production of current limiter cables.

The arrangement of the superconducting current limiter according to the invention aims to use a plurality of superconducting cables placed in parallel to produce a superconducting conductor. The number of superconducting cables placed in parallel depends on the current that will have to flow in the superconducting conductor thus formed. Placing a plurality of superconducting cables in parallel increases the critical current of the superconducting conductor thus formed. Channeling the current intended for one conductor in a plurality of cables forming this conductor makes it possible for example to use superconducting cables that are available as standard industrial products but that are under-dimensioned for a high-current application. It may thus be contemplated to industrialize this type of current limiter with a reduction in cost and simplification in terms of implementation.

The structure of the superconducting current limiter ensures effective cooling around each cable that forms a superconducting conductor, and between the turns of the coil. A cooling fluid may thus flow between all of the superconducting cables, both between superconducting cables of different potentials and between superconducting cables of the same potential.

Within one and the same superconducting conductor, the superconducting cables forming same additionally benefit from a high-performance heat transfer by virtue of the electrically conductive spacers, since electrically conductive materials generally also have better thermal conductivity than electrical insulators.

When a plurality of cables are used jointly to channel a current, these cables being at the same potential, it is common in the prior art to group them together in one and the same sheath. However, for applications using a superconducting conductor, juxtaposing, adhesively bonding or soldering superconducting cables is detrimental to the cooling of the assembly. In applications as a current limiter, cooling is a crucial function since it is directly responsible both for preserving the material (which may be destroyed if it heats up excessively) and returning the cables, and therefore the general operation of the device, to the superconducting state. Since the dissipation time for heat in a material increases with the square of the distance, juxtaposing various superconducting cables so as to form a superconducting conductor would lead to a significant loss in cooling capacity. For example, if the superconducting cables are strips, a stack of five of these strips will exhibit performance approximately twenty-five times worse than just one of these strips with regard to transmitting heat transversely in this stack. According to the invention, on the other hand, each superconducting cable is cooled longitudinally on either side, while at the same time being kept at the same electrical potential as the adjacent superconducting cables that form part of the same superconducting conductor.

Moreover, the spacer that is arranged between two superconducting cables forming one and the same conductor, which electrically insulates the two cables in the prior art, is used here by contrast to create an electrical connection between these cables. This electrical connection takes place between two cables that are at the same electrical potential, and is therefore not intended to channel current in steady state. However, in the event of a local fault on a cable, the current may then be diverted to the adjacent cables in order to continue its progress in the conductor.

Specifically, superconducting cables designed for a current limiter application often have defects called "hotspots" that are linked to a variation in their degree of homogeneity. These hotspots locally increase the temperature of the superconducting cable, and this temperature increase may lead to irreversible damage to the material. For example, in the case of using what are called "high critical temperature" superconducting strips, such as REBCO strips mentioned above, to form a superconducting cable, the presence of hotspots is known to be a critical point that degrades the general performance of the current limiter. By virtue of the electrically conductive spacers arranged between the superconducting cables of one and the same conductor, not only is the cooling of these cables optimized, but a possible redundant path is additionally offered for the current that may have to transit via a hotspot or any other defect, and which may thus bypass it.

This arrangement of the current limiter also opens up possibilities for optimizing the bulk of the current limiter. Specifically, in the prior art, the increase in the critical current is often achieved by stacking a plurality of windings, each extending in its respective plane. The invention offers the choice, in the design phase, of increasing the number of stacked windings, and/or increasing the number of superconducting cables that form all of the conductors, or some of the conductors, of all of the stacked windings, or only some of these stacked windings. Depending on the available space, the final shape of the current limiter may thus be optimized by giving preference to width or height.

The current limiter may have the following additional features, on their own or in combination:
the coil is a bifilar coil;
the current limiter has an inter-turn space between two windings of the superconducting conductor, and has an inter-cable space between two superconducting cables of the same superconducting conductor, the electrically insulating spacer being arranged along the inter-turn space and the electrically conductive spacer being arranged along the inter-cable space;
the electrically conductive spacer is made of metal;
the electrically conductive spacer consists of a semiconductor material;
the metal of the electrically conductive spacer has a thermal conductivity greater than 150 W/m/K;
the electrically conductive spacer is in the form of a folded or corrugated strip;
the electrically conductive spacer has flow gaps for the cooling fluid;
the electrically conductive spacer and the electrically insulating spacer have substantially the same shape;
the electrically conductive spacer exhibits anisotropic electrical conduction behavior that promotes electrical conduction between said two superconducting cables;
the electrically conductive spacer is discontinuous and formed of discrete spacers;
the electrically conductive spacer is formed by juxtaposing conductive spacers and insulating spacers;
the electrically conductive spacer has metal bridges between said two superconducting cables and struts arranged between these metal bridges;
the struts are electrically conductive;
the struts are electrically insulating;
the current limiter furthermore has a cooling device comprising a cooling fluid in contact with the electrically insulating spacers, between the turns of the coil, and with the electrically conductive spacers, between the superconducting cables;
the conductive spacer has soles or bases that increase the contact area with the two superconducting cables;
the conductive spacer has heat exchangers for exchanging heat with the cooling fluid.

Preferred exemplary embodiments of the invention will now be described with reference to the appended drawings, in which:

FIG. 1 schematically shows a current limiter according to the invention, formed by a stack of coils;

FIG. 2 schematically shows one of the coils, seen from above, of the current limiter from FIG. 1;

Figure 1:
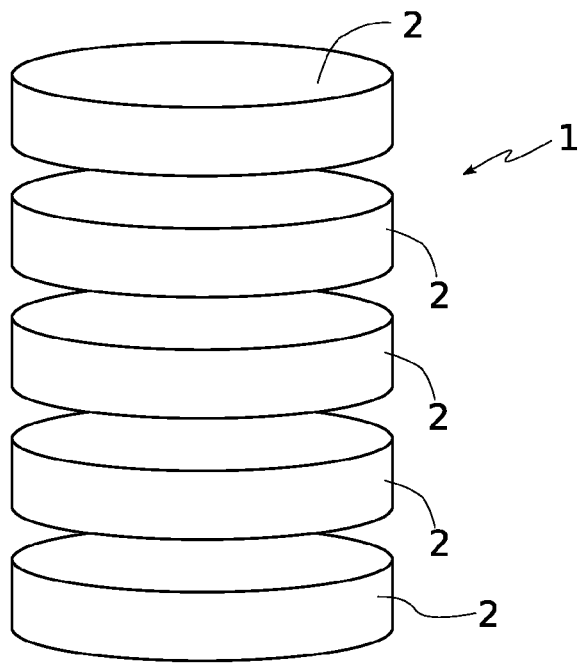

FIG. 1 schematically shows a superconducting current limiter according to the invention. This current limiter 1 has at least one coil formed of at least one superconducting conductor wound in a single plane. In the example of FIG. 1, the current limiter 1 has five wound coils. The current limiter 1 has as many coils 2 as required, depending on the current and the voltage to be handled.

Figure 2:
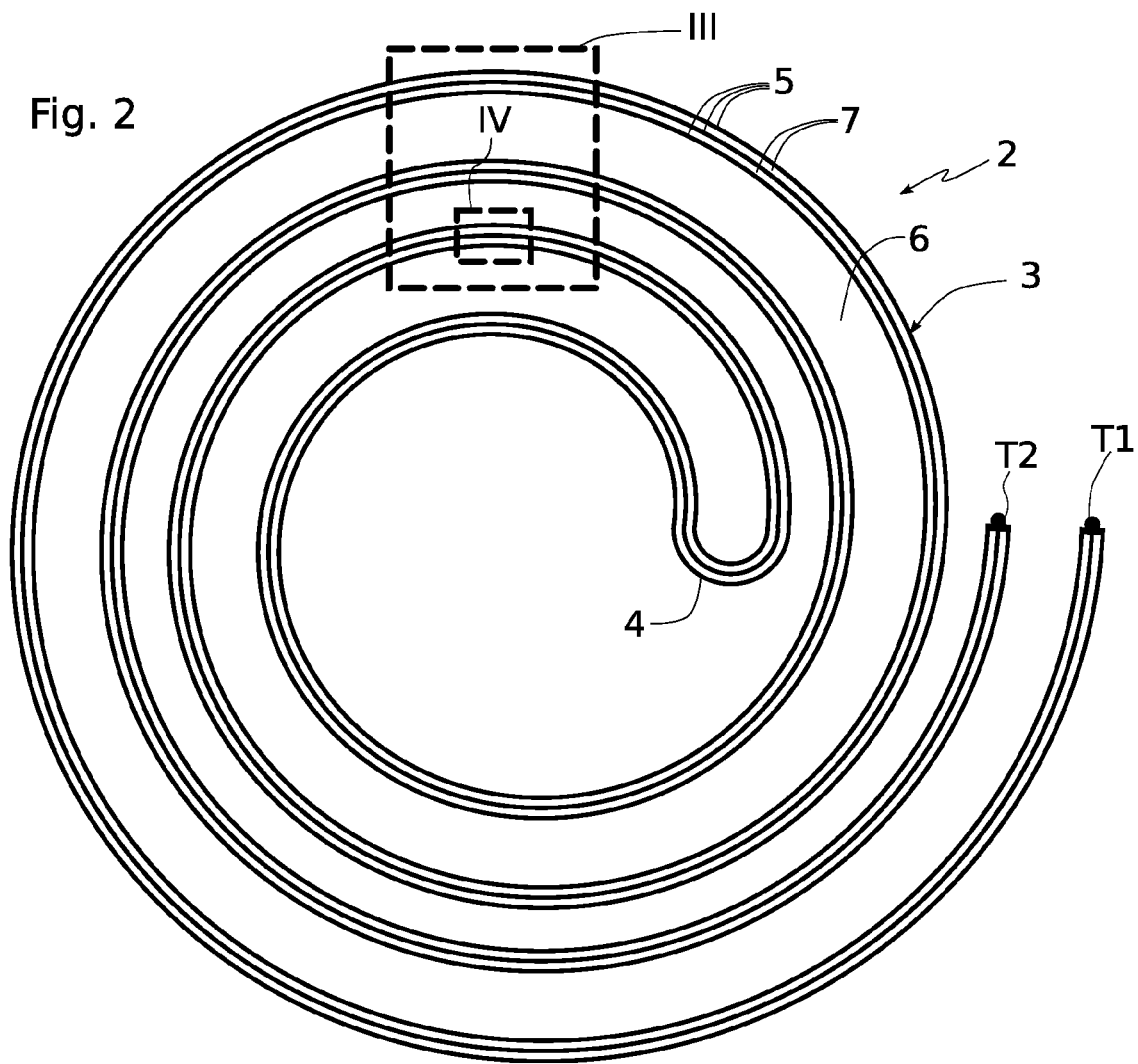

FIG. 2 schematically shows, seen from above, one of the coils 2 forming the current limiter 1. The coil 2 is in this case a dipole having a first connection terminal T1 and a second connection terminal T2. If the coil 2 is the only coil of the current limiter 1, the connection terminals T1 and T2 are the terminals of the current limiter 1 via which it will be connected to the electrical circuit to be protected. If the current limiter 1, as in the example of FIG. 1, has a plurality of coils 2, these will be placed in series and/or in parallel through an appropriate connection of their respective connection terminals T1, T2.

In the present example, the coils 3 are bifilar coils, that is to say that the conductor forming them makes one or more round trips between the periphery of the coil and the center of the coil.

In the coil 2, a superconducting conductor 3 connects the first connection terminal T1 to the second connection terminal T2, forming a winding. In this simplified example, the conductor 3 starts from the first connection terminal T1, is wound around forming two turns and then, at the center of the spiral, forms a bend 4 so as then to form two turns again and, at the periphery of the spiral, joins the second connection terminal T2.

In the example of FIG. 2, which is a simplified example for the purposes of the description, the coil 2 has a single superconducting conductor 3 and its two terminals T1, T2, the conductor 3 being formed of three assembled superconducting cables 5. The three superconducting cables 5 each have a first end and a second end, the three first ends being connected together at the first terminal T1 and the three second ends being connected together at the second terminal T2. The three superconducting cables 5 forming the conductor 3 are wound in parallel in the bifilar coil.

The length of the superconducting conductor, and therefore the number of turns of the winding, is also simplified in the drawings. By way of example, for a current limiter or a current limiter portion intended for 25 kV and whose superconducting conductor has a line resistance allowing a voltage drop of 50 V/m when it becomes resistive, this conductor will have to have a length of the order of 500 m, thereby leading to a coil with a diameter of several meters and with a very high number of turns.

The spaces situated between two turns of the coil 2, that is to say the spaces between two turns of the conductor 3, are called "inter-turn spaces 6". The spaces situated between two superconducting cables 5 within the conductor 3 are called "inter-cable spaces 7".

The inter-turn spaces 6 contain electrically insulating spacers, and the inter-cable spaces 7 contain electrically conductive spacers. These spacers have not been shown in the simplified view of FIG. 2 and will be described below with reference to FIGS. 3 to 5.

Figure 3:
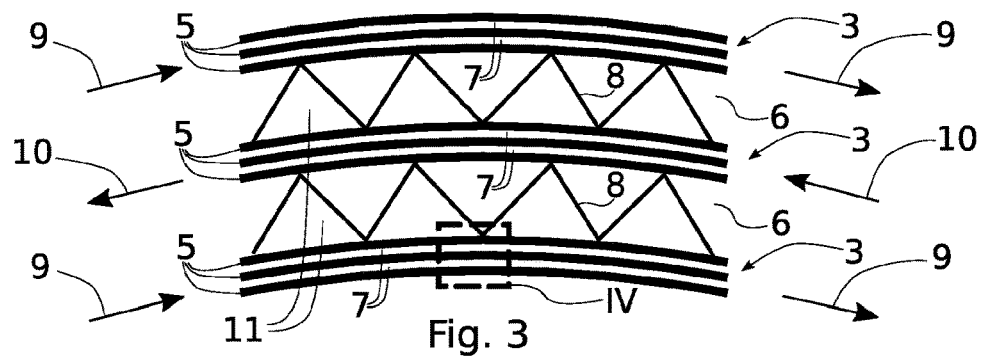
FIG. 3 is a magnified schematic view of the frame III in FIG. 2.

FIG. 3 is a magnified view of the frame III visible in FIG. 2. FIG. 3 therefore shows three portions of turns of the conductor 3. An insulating layer consisting of an electrically insulating spacer 8 is arranged between each turn of the conductor 3. In this example, a current flows from the first connection terminal T1 to the second connection terminal T2, and arrows in FIG. 3 show the flow direction of this current. Although the current in this example always flows in the same direction along the conductor 3, the coil-shaped winding leads to the formation of turns, such that the current flows in the opposite direction between a portion of the conductor 3 and another portion of the conductor 3 situated on an adjacent turn. For the portions of the conductor 3 or the cables 5 that are shown, the flow of the current in one direction (from left to right in the figures) will be shown schematically by arrows 9, whereas the flow of the current in the other direction (from right to left) will be shown schematically by arrows 10. In the turn portion at the top of FIG. 3, the current flows from left to right along the arrows 9; in the turn portion in the middle, the current flows from right to left along the arrows 10; and in the turn portion at the bottom, the current flows from left to right along the arrows 9.

The insulating spacer 8 has a shape designed to maintain the inter-turn space 6, to electrically insulate the two corresponding adjacent turns, and to be able to be traversed by a cooling fluid. The insulating spacer 8 is made from any insulating material that is rigid enough to allow the spacing of the inter-turn space 6 to be maintained. The insulating spacer 8 is formed here by a sheet of insulating material that is folded, that is to say folded in a triangle, or corrugated, thereby forming gaps 11 allowing the cooling fluid to flow.

The current limiter 1 is cooled to the appropriate temperature for maintaining the superconducting properties of the conductor 3. The coil or coils 2 are thus bathed in a fluid such as liquid nitrogen, or this fluid is put into circulation by a cooling circuit. This cooling fluid is in contact with the conductor 3 by virtue of the gaps 11 in the insulating spacers 8 and by virtue of the gaps 13 in the conductive spacers 12.

Figure 4:
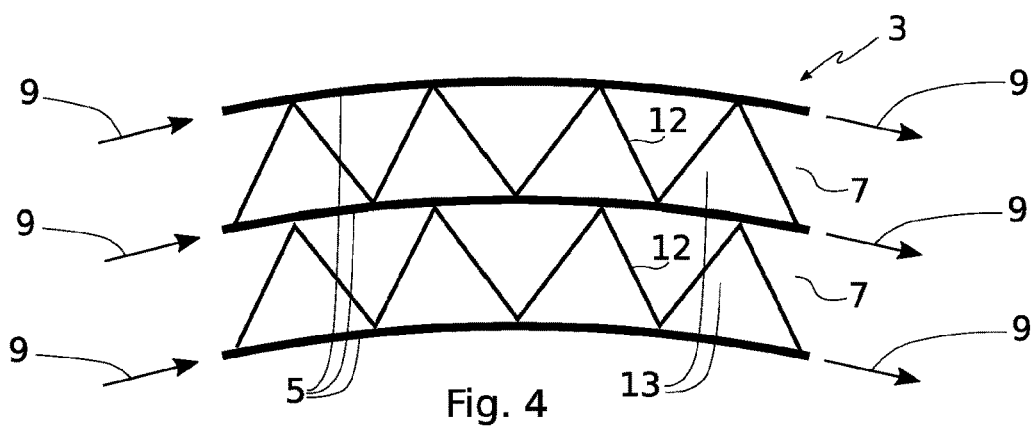
FIG. 4 is a magnified schematic view of the frame IV visible in FIGS. 2 and 3.

FIG. 4 is a magnification of the frame IV visible in FIGS. 2 and 3. This magnification shows a portion of the conductor 3. In the three cables 5 forming the conductor 3, the flow direction 9 of the current is the same. Conductive spacers 12 are arranged between these cables 5, within the conductor 3, in the inter-cable spaces 7.

The conductive spacers 12 have three functions:
maintaining the spacing between two cables 5;
channeling the current between the two cables 5;
being able to be traversed by the cooling fluid.

The conductive spacers 12 have the same shape in terms of structure, in the present example, as the insulating spacer 8, and have gaps 13 allowing the cooling fluid to flow and allowing heat exchanges directly with the cables 5 and indirectly via the conductive spacers 12.

The conductive spacers 12 are made from an electrically conductive material, for example a metal or a semiconductor material. The conductive spacers 12 are each in contact with two cables 5 and thus create electrical continuity between these two cables 5. In steady state, the cables 5 have superconducting properties, whereas the conductive spacers 12 have the properties of a conventional conductor. The current will therefore preferably flow in the superconducting cables 5, which have a resistance of virtually zero, rather than in the conductive spacers 12 which, although they are conductive, have a certain resistance. The conductive spacers 12 will however balance the distribution of the current and the potentials, and guarantee that a significant potential difference is not able to develop between two superconducting cables 5 of the same conductor 3.

The whole coil 2 is cooled by the same cooling fluid that flows both through the insulating spacers 8 and through the conductive spacers 12. The metal forming the conductive spacers is preferably a metal having a high thermal conductivity, for example greater than 150 W/m/K, such as copper or aluminum. The thermal conductivity and electrical conductivity functions are thus optimally ensured by the conductive spacers 12.

Use will advantageously be made of the geometries of conductive spacers 12 that optimize heat exchanges between the conductive spacers 12 and the cooling fluid, and that optimize heat exchanges and electrical conduction between two cables 5. Fin-shaped structures may in particular be used, as may any method that reduces contact resistances.

Figure 5:
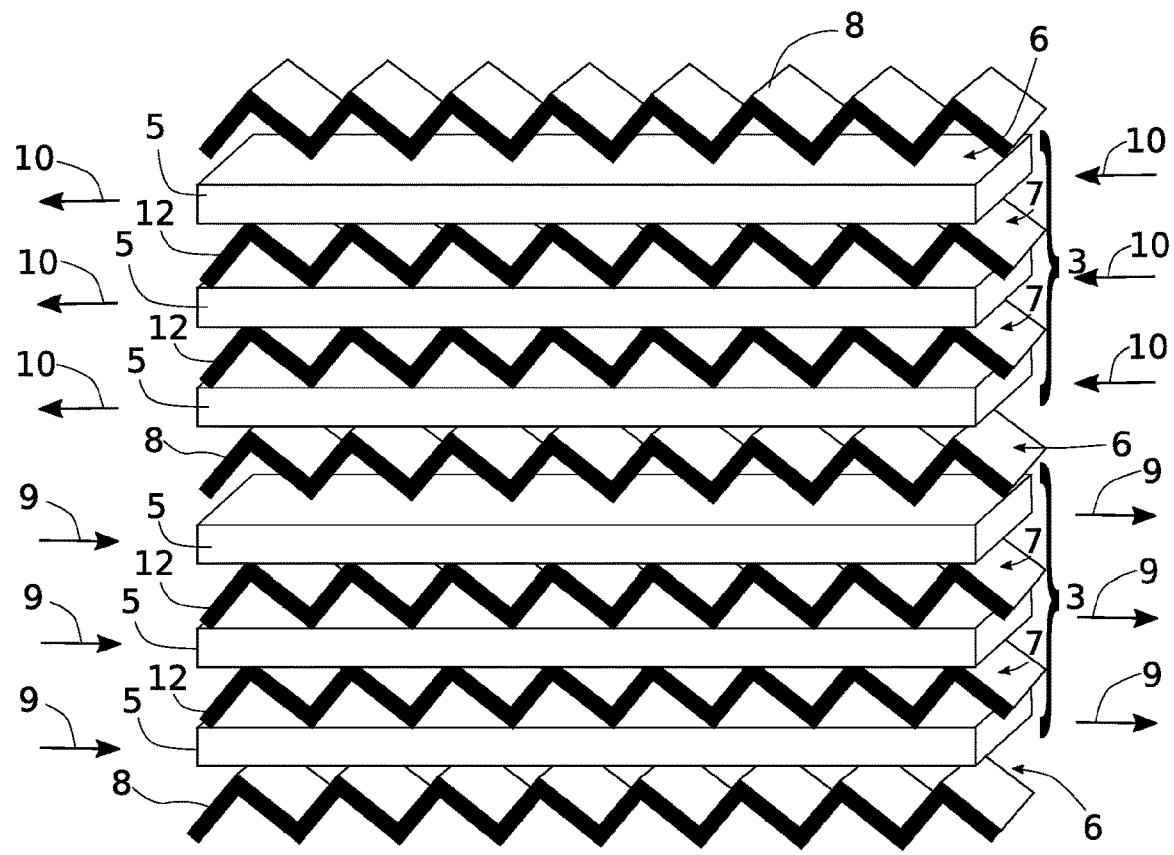
FIG. 5 is a perspective partial schematic view of a stack of superconducting cables of the coil from FIG. 2.

FIG. 5 schematically illustrates a portion of the coil 2 showing two adjacent turns of the conductor 3 and the arrangement of the insulating spacers 8 and conductive spacers 12. In this figure, the inter-turn spaces 6 and the inter-cable spaces 7 have the same spacing. The insulating spacer 8 and the conductive spacers 12 have the same shape and the same dimensions here, and differ in terms of their basic material, which is respectively insulating and electrically conductive. As a variant, the sizes of the spacers 8 and 12 may be different from one another if it is desired to create variable spacings between the cables 3 and/or between the conductors 5 within the coil.

In the schematic three-dimensional depiction in FIG. 5, the superconducting cables 5 forming the conductor 3 are conventional superconducting strips, for example REBCO strips. The insulating spacer 8 and the conductive spacers 12 are folded strips.

FIG. 5 therefore shows: at the top of the figure, a first portion of the conductor 3, with the three portions of cables 5 forming it: and at the bottom of the figure, a second portion of the conductor 3, corresponding to the adjacent turn, with the three portions of cables 5 forming it. Two portions of conductive spacers 12 appear within each conductor 3, between the cables 5. One portion of insulating spacer 8 is visible between the two conductors 3, as well as above the portion of the conductor 3 at the top and below the portion of the conductor 3 at the bottom, so as to interact with the adjacent turns, not shown.

This stack of superconducting cables 5 and spacers 8, 12 is flowed through by the cooling fluid.

In the cables 5 of the portion of the conductor 3 at the top, the current flows in the direction 10, whereas, in the cables 5 of the portion of the conductor 3 at the bottom, the current flows in the direction 9. The flow directions 9 and 10 of the current have been shown for each superconducting cable 5.

Figure 6:
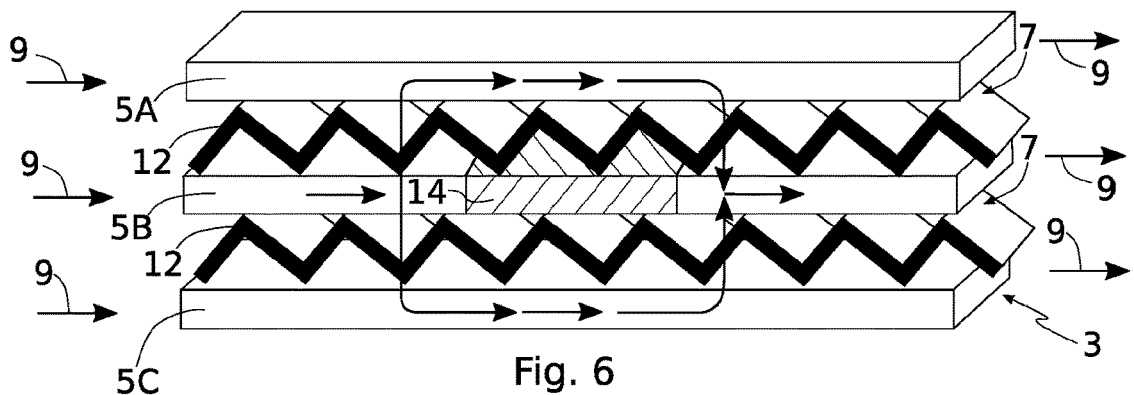
FIG. 6 is a detailed view of FIG. 5, showing a situation with a flow of current in the case of a local hotspot defect.

FIG. 6 shows a portion of the conductor 3 and shows the three cables 5A, 5B, 5C forming it, as well as the two conductive spacers 12 maintaining the spacing and the electrical conductivity between these three cables 5. The current flows in the direction of the arrows 9. This FIG. 6 illustrates the behavior of the conductor 3 in the event of the occurrence of a hotspot 14.

In this example, the hotspot 14 occurs on the cable 5B in the middle. Upstream of the hotspot 14, the current flows in the same way in the cables 5A, 5B, 5C, benefiting from their superconducting properties. In the cable 5B, the current, arriving at the hotspot 14, no longer benefits from the superconducting properties of the cable, which may even become locally highly resistive.

Upstream of the hotspot 14, at least some of the current will be diverted by the conductive spacers 12 and will thus bypass the hotspot 14 via the other cables 5A, 5C. Downstream of the hotspot 14, the conductive spacers balance the currents by allowing a portion of the current to return to the cable 5B.

FIGS. 7 to 20 relate to variant embodiments of the conductive spacers 12. In the various embodiments and variants, elements having the same function bear the same reference number in the figures.

Figure 7:
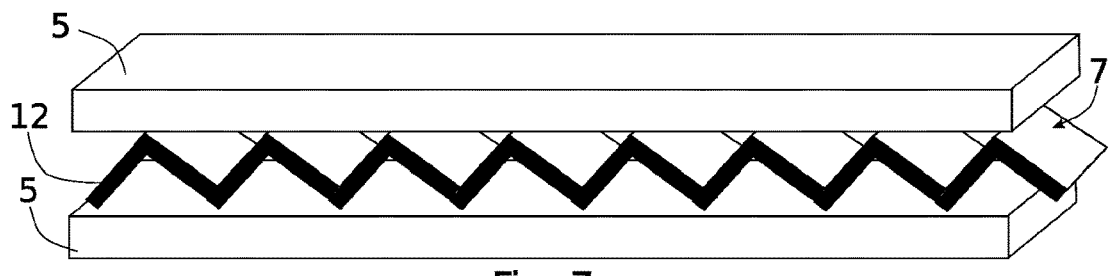
FIGS. 7 to 20 illustrate variant embodiments of the conductive spacers shown in FIGS. 4 to 6.

FIG. 7 is a simplified view showing a portion having two superconducting cables 5 of one and the same conductor 3 and the conductive spacer 12 arranged between these two cables 5. FIG. 7 illustrates the implementation of the conductive spacers 12 described in FIGS. 5 and 6. The conductive spacer 12 in FIG. 7 therefore consists of a folded metal strip in contact on either side with the two cables 5.

Figure 8:
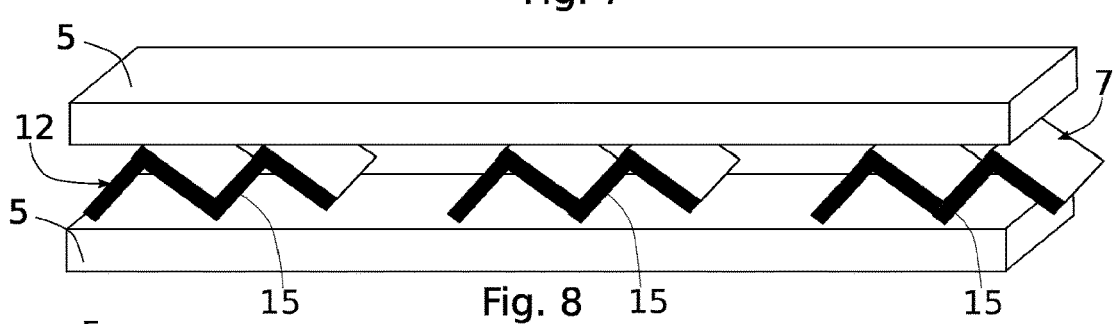

The variant in FIG. 8 illustrates a case in which the conductive spacer 12 is discontinuous. It is formed of a plurality of discrete spacers 15 distributed over the entire length of the inter-cable space 7. The conductive spacer 12 therefore creates electrical conduction between the two cables 5, in particular in order to balance the currents and bypass a possible hotspot. However, the conductive spacer 12 is able to contribute to channeling the current only over certain portions of the length of the inter-cable space 7, thereby bestowing on the conductive spacer 12 anisotropic electrical conduction behavior, that is to say behavior exhibiting high conductivity between two cables 5 but low or even zero conductivity in the flow direction of the current along the cables 5.

This anisotropic conduction behavior avoids an excessive reduction in the electrical resistance of the coil 2 when it is in current-limiting mode.

Figure 9:
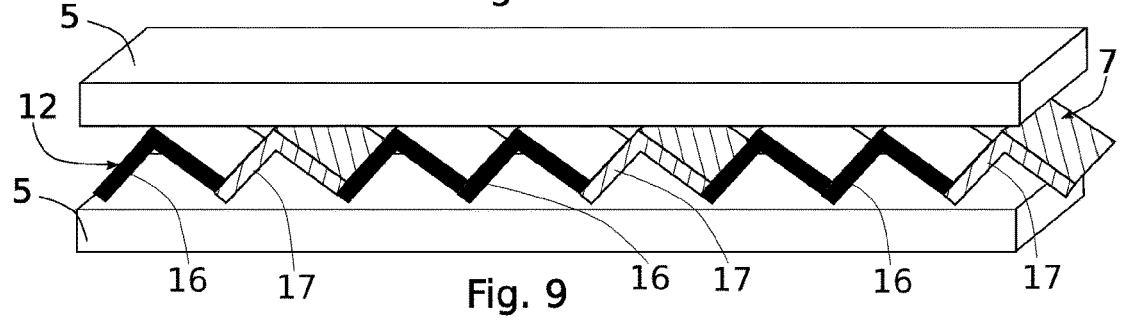

FIG. 9 illustrates another variant for the conductive spacer 12, bestowing on it anisotropic electrical conduction behavior. According to this variant in FIG. 9, the conductive spacer 12 is produced from a set of metal spacers 16 and insulating spacers 17 (shown in hatched form in FIG. 17) arranged alternately along the inter-cable space 7. The conductive spacer 12 thus creates a spacing over the entire length of the inter-cable space 7 while at the same time limiting the flow of current along the conductive spacer 12 by virtue of the insulating spacers 17, which consist for example of an electrically insulating polymer.

Figure 10:
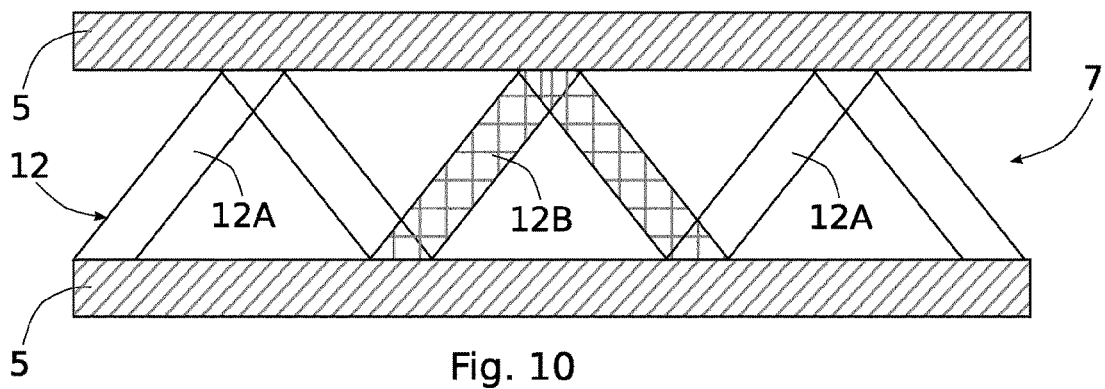

FIG. 10 illustrates a variant similar to the variant in FIG. 9, in which the conductive spacer 12 consists of an alternation of a conductive portion 12A (in the shape of an inverted V in the figure) and of an insulating portion 12B (in the shape of an inverted V).

Figure 11:
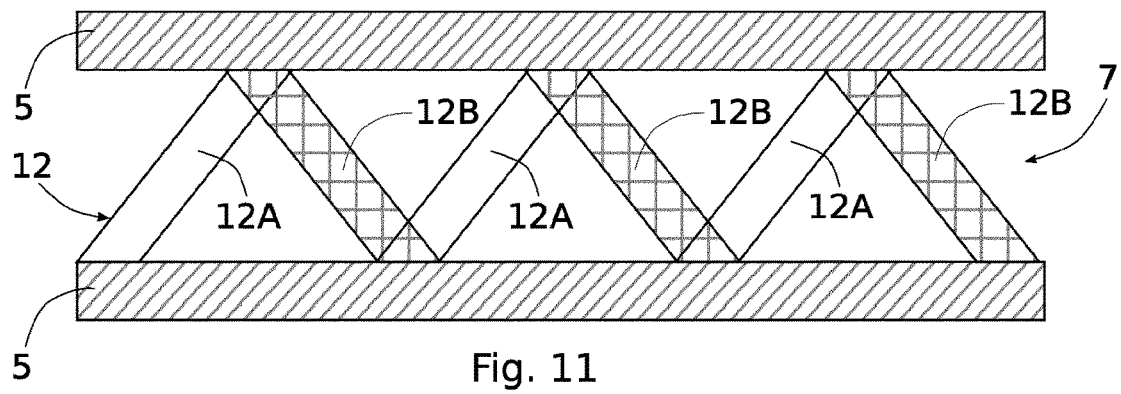

FIG. 11 shows another variant in which the alternation of the conductive and insulating portions is produced by virtue of the fact that one 12A of the branches of the inverted V is conductive and the other branch 12B is insulating.

Figure 12:
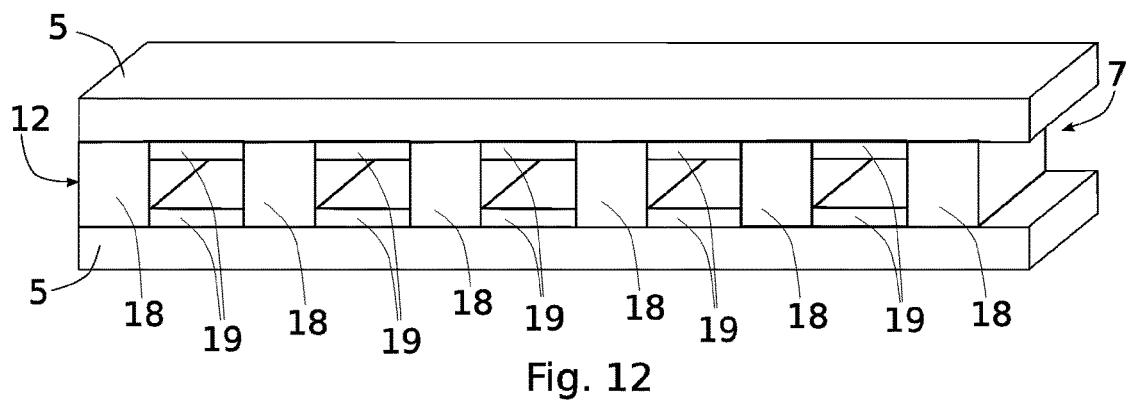

FIG. 12 illustrates another variant for producing the conductive spacer 12, also bestowing on it anisotropic electrical conduction behavior. The conductive spacer 12 is formed here by a succession of metal bridges 18 and struts 19 arranged between these bridges 18. The metal bridges 18 create electrical conductivity between the cables 5, and the struts 19 keep the bridges 18 in position. The struts 19 may be made from insulating material, and the behavior of the conductive spacer 12 will then be similar to that of the variant in FIG. 9. The struts 19 may also be made from conductive material, for example metal material, the conductive spacer 12 then exhibiting anisotropic behavior in any case, preserving the conduction between the cables 5 while at the same time reducing it along the inter-cable space 7.

Figure 13:
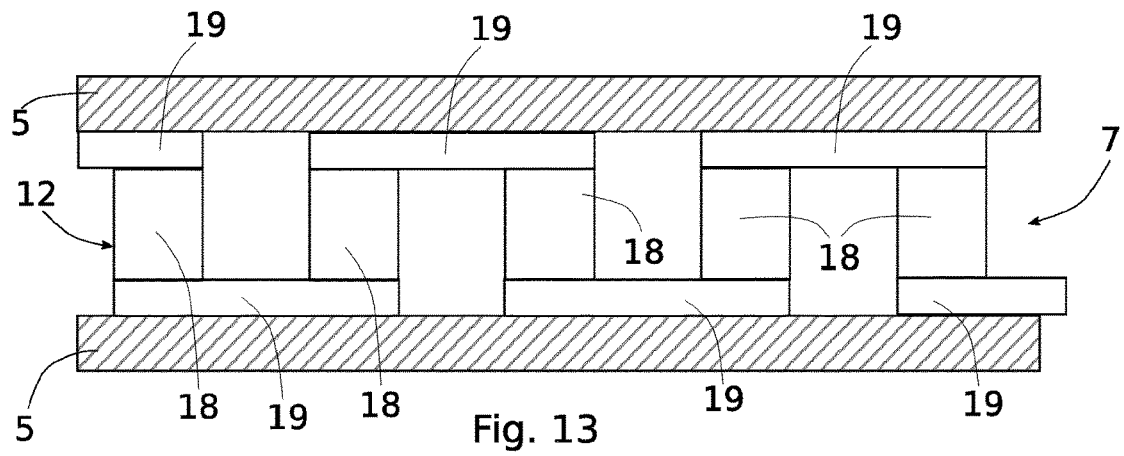

FIG. 13 illustrates an alternative arrangement of the struts 19, in which the struts 19 each connect two bridges 18, the struts 19 at the top being arranged offset with respect to the struts 19 at the bottom.

Figure 14:
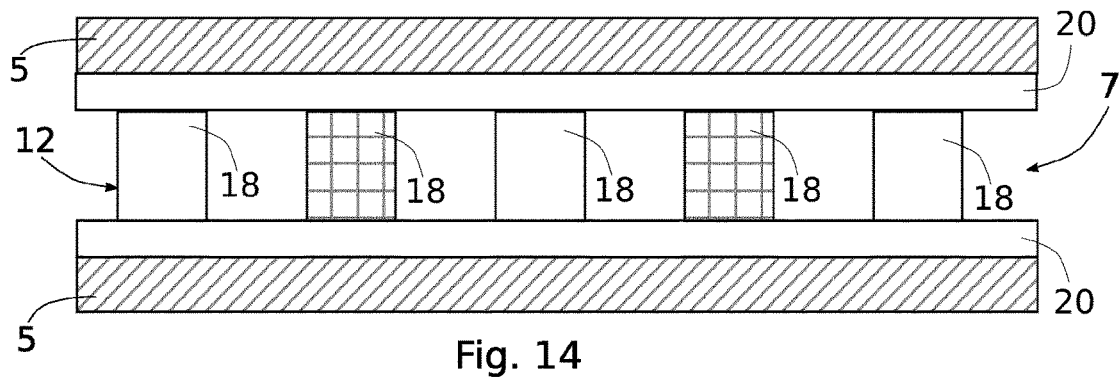

FIG. 14 illustrates a variant in which the bridges 18 are connected by soles 20, respectively to the cable 5 at the top and to the cable 5 at the bottom. Optionally, some of the bridges 18 (in this case one out of two) are insulating (the insulating bridges 18 are shown in hatched form).

Figure 15:
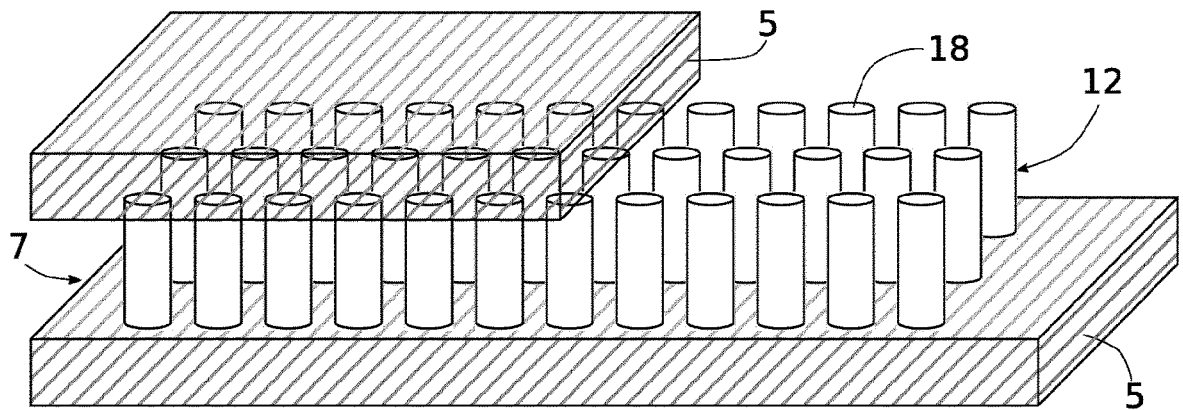
Figure 16:
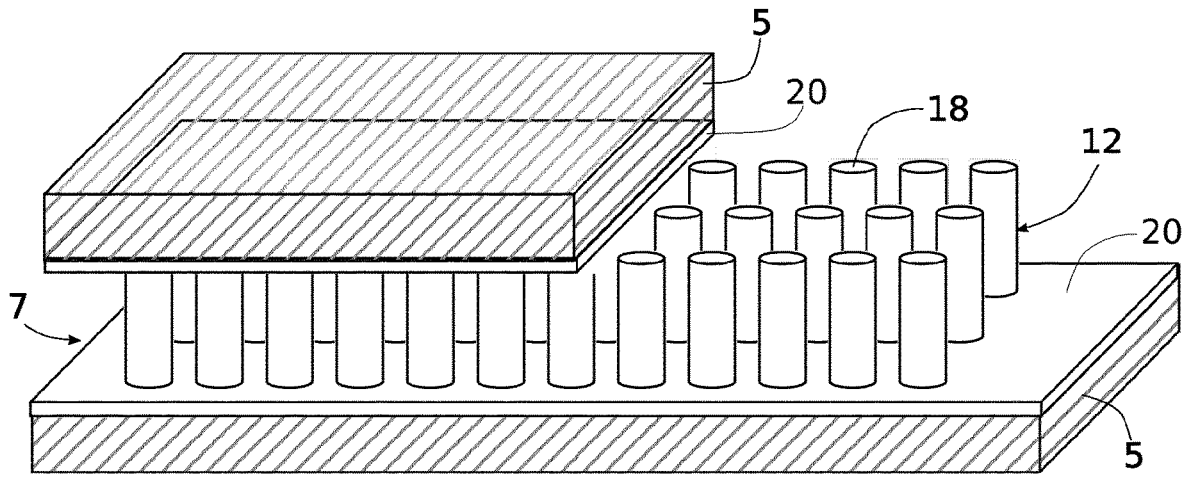

FIGS. 15 and 16 illustrate variants in which the bridges 18 consist of cylinders connecting the two cables 5. In the variant of FIG. 15, the bridges 18 directly connect the cables 5. In the variant of FIG. 16, the bridges 18 connect the cables 5 via a sole 20 that is arranged against each of the cables 5.

The soles 20 in FIGS. 14 and 16 also increase the contact area between the conductive spacer 12 and the cables 5, and thus promote heat exchange, thereby making the cooling of the cables 5 by the cooling fluid more efficient.

Figure 17:
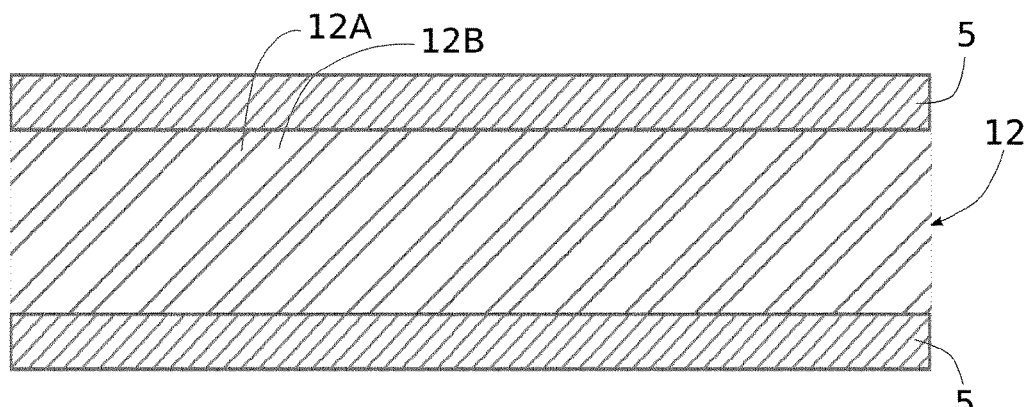

FIG. 17 illustrates another embodiment in which the insulating spacer 12 consists of a material formed alternately of conductive layers 12A and of insulating layers 12B.

Figure 18:
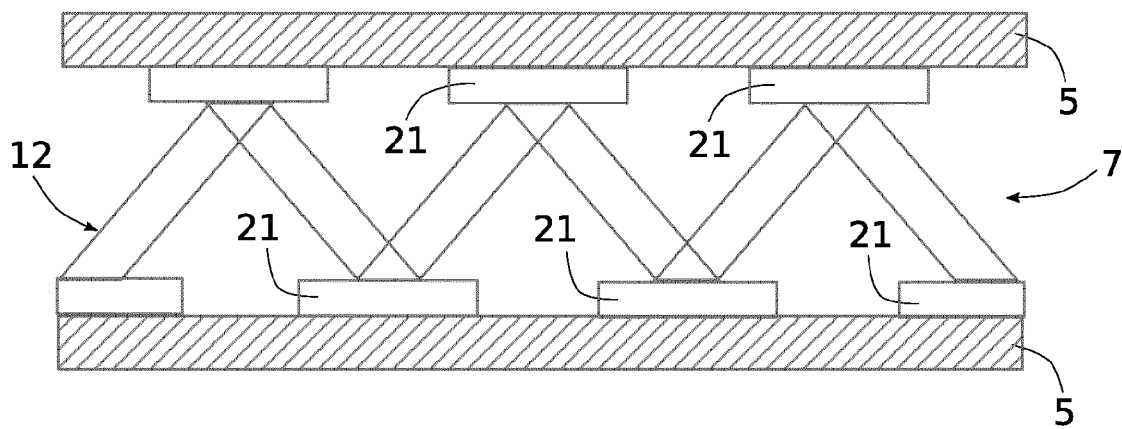
Figure 19:
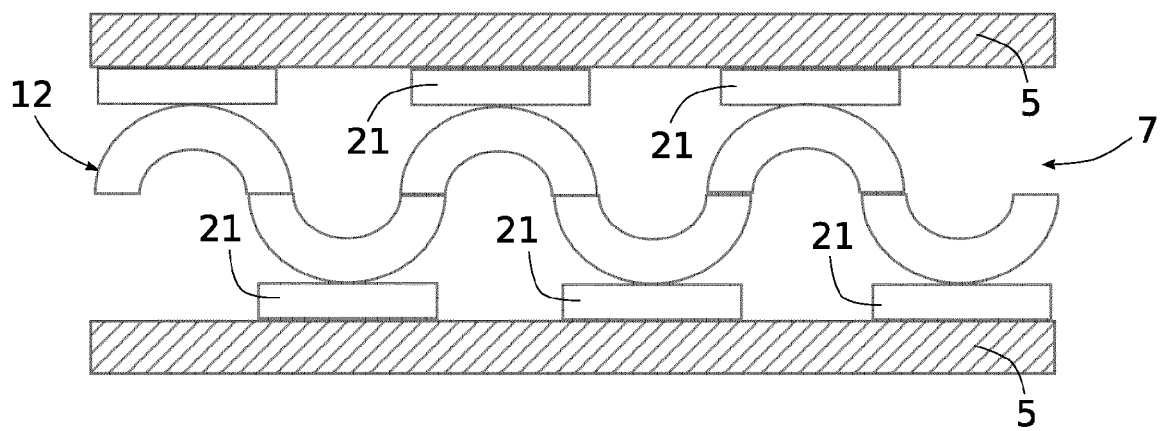
Figure 20:
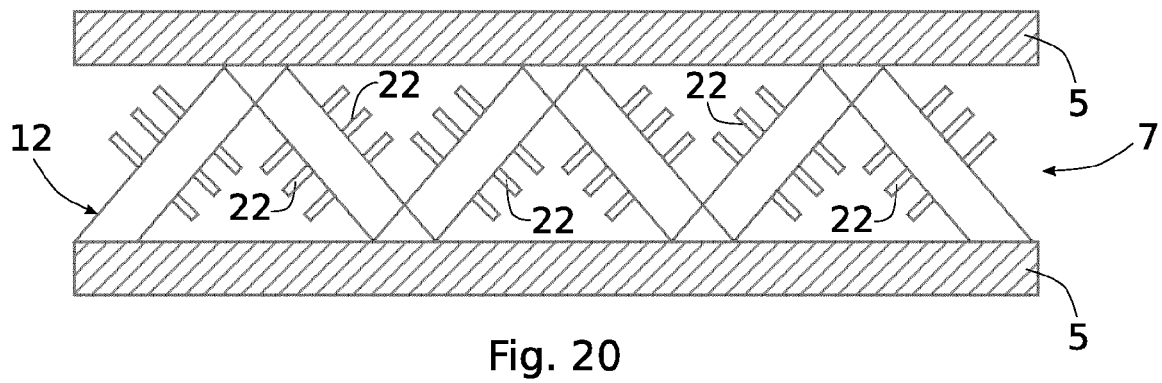

FIGS. 18 to 20 illustrate variants of the conductive spacer 12 in relation to the heat exchange capacity of the conductive spacer 12.

FIG. 18 illustrates a variant of the conductive spacer 12 from FIG. 7. According to this variant, the conductive spacer 12 has bases 21 attaching the tops of the folds forming the spacer 12 to the cables 5. These bases 21 increase the contact area between the conductive spacer 12 and the cables 5 and thus promote heat exchange, thereby making the cooling of the cables 5 by the cooling fluid more efficient.

FIG. 19 is similar to FIG. 18, the conductive spacer 12 in this case being corrugated. This corrugated shape of the spacer 12 may optionally be provided without the bases 21.

FIG. 20 illustrates a variant of the conductive spacer 7 in which the spacer 12 has an additional heat exchanger consisting of fins 22 that increase the contact area with the cooling fluid. The additional heat exchanger is defined here as a device for increasing the exchange area of the spacer 12.

Figure 21:
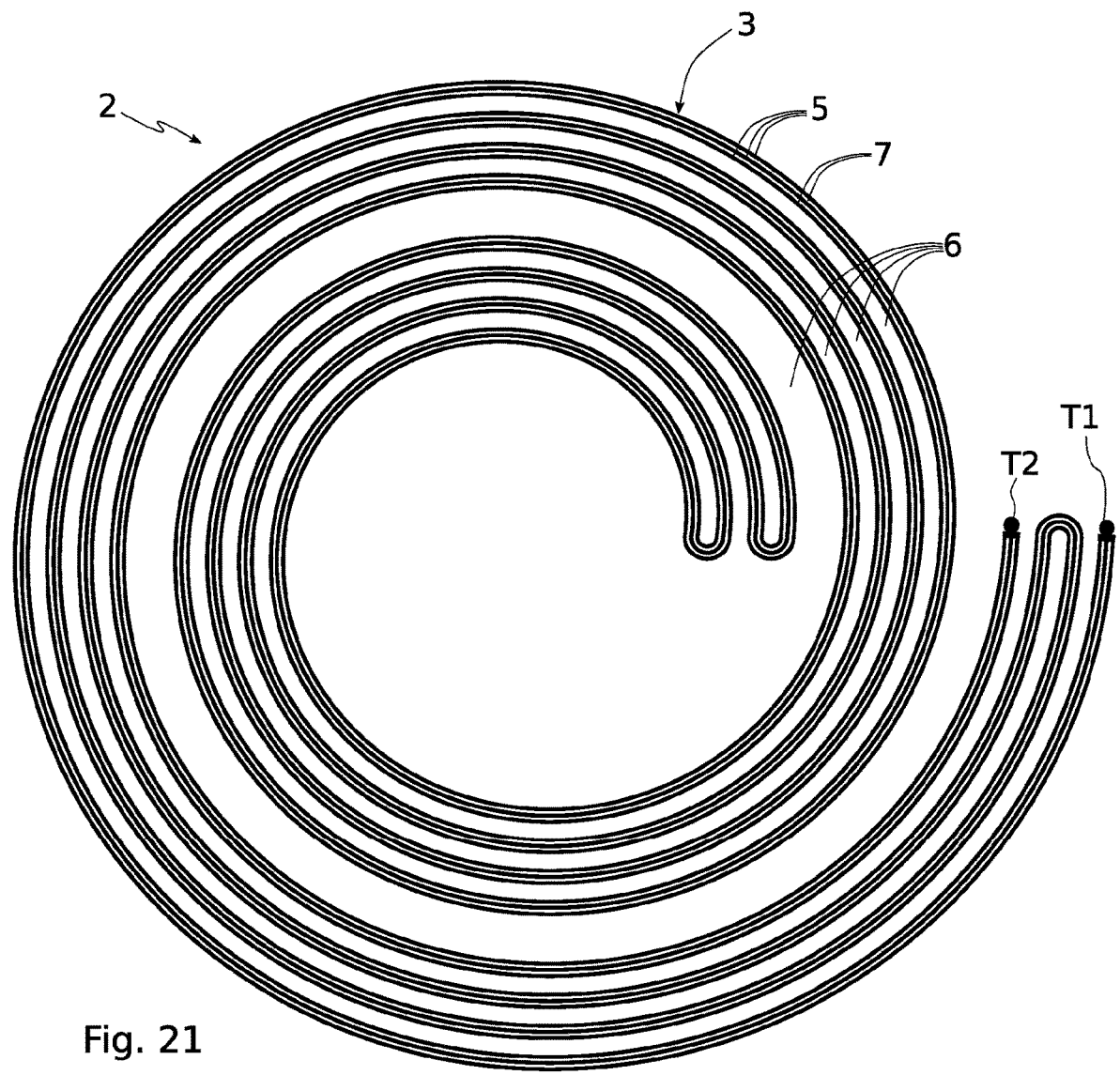
FIG. 21 shows a variant of a coil, seen from above, for the current limiter from FIG. 1.

FIG. 21 illustrates a variant embodiment of the coil 2 designed to form a current limiter 1. According to this variant, the superconducting conductor 3 is designed to perform two round trips between the periphery of the coil and the center of the coil. Regardless of the arrangement and the number of conductors 3, conductive spacers are arranged in the inter-cable spaces 7 and insulating spacers are arranged in the inter-turn spaces 6.

Other variant embodiments of the current limiter may be contemplated without departing from the scope of the invention. For example, a superconducting conductor of the current limiter may have any number of superconducting cables in order to form it, one or more conductive spacers being arranged between these cables or groups of cables.

Likewise, a coil may have any number of superconducting conductors wound so as to form the coil and the corresponding number of connection terminals, one or more insulating spacers being arranged so as to separate each turn formed by these various superconducting conductors.

The coil may be any type of bifilar or non-bifilar coil. It may have a cylindrical, oval or rectangular shape.

The current limiter may also have any number of stacked coils, whose connection terminals are connected to one another in series or in parallel.

The material and the shape of the conductive spacers may vary while still allowing both the electrical conduction over at least some portions of the conductive spacer and the ability of the cooling fluid to traverse. The conductive spacers may be made from a porous conductive material, or have flow ducts for the cooling fluid, for example.

The anisotropic electrical conduction behavior may be bestowed on the electrically conductive spacers by other means, such as by virtue of intrinsically anisotropic crystalline materials. These materials will advantageously be used by arranging them such that they have greater electrical conduction in the transverse direction, that is to say between two cables 3, than in the longitudinal direction, that is to say along the inter-cable spaces 7.

The various embodiments and variants of the conductive spacer 12 may be combined.

The invention claimed is:

1. A superconducting current limiter (1) comprising:
at least one superconducting conductor (3) wound so as to form a coil (2) extending in a single plane and connecting a first electrical connection terminal (T1) to a second electrical connection terminal (T2), an electrically insulating spacer (8) being arranged between two turns of the coil (2), wherein:
the at least one superconducting conductor (3) consists of at least two separate superconducting cables (5) wound in parallel and whose ends are electrically connected by the first electrical connection terminal (T1) and by the second electrical connection terminal (T2), respectively; and in that an electrically conductive spacer (12) is arranged between two of said separate superconducting cables (5), the electrically conductive spacer (12) providing electrical continuity between the two superconducting cables, the electrically conductive spacer (12) being able to be traversed by a cooling fluid.

2. The current limiter as claimed in claim 1, wherein the coil (2) is a bifilar coil.

3. The current limiter as claimed in claim 1, further comprising an inter-turn space (6) between two windings of the superconducting conductor (3), and in that it has an inter-cable space (7) between two superconducting cables (5) of the same at least one superconducting conductor (3), the electrically insulating spacer (8) being arranged along the inter-turn space (6) and the electrically conductive spacer (12) being arranged along the inter-cable space (7).

4. The current limiter as claimed in claim 1, wherein the electrically conductive spacer (12) is made of metal.

5. The current limiter as claimed in claim 1, wherein the electrically conductive spacer (12) consists of a semiconductor material.

6. The current limiter as claimed in claim 4, wherein the metal of the electrically conductive spacer (12) has a thermal conductivity greater than 150 W/m/K.

7. The current limiter as claimed in claim 1, wherein the electrically conductive spacer (12) is in a form of a folded or corrugated strip.

8. The current limiter as claimed in claim 1, wherein the electrically conductive spacer (12) has flow gaps (13) for the cooling fluid.

9. The current limiter as claimed in claim 1, wherein the electrically conductive spacer (12) and the electrically insulating spacer (8) have substantially the same shape.

10. The current limiter as claimed in claim 1, wherein the electrically conductive spacer (12) exhibits anisotropic electrical conduction behavior that promotes electrical conduction between said two superconducting cables (5).

11. The current limiter as claimed in claim 10, wherein the electrically conductive spacer (12) is discontinuous and formed of discrete spacers (15).

12. The current limiter as claimed in claim 10, wherein the electrically conductive spacer (12) is formed by juxtaposing conductive spacers (16) and insulating spacers (17).

13. The current limiter as claimed in claim 10, wherein the electrically conductive spacer (12) has metal bridges (18) between said two superconducting cables (5) and struts (19) arranged between these metal bridges.

14. The current limiter as claimed in claim 13, wherein the struts (19) are electrically conductive.

15. The current limiter as claimed in claim 13, wherein the struts (19) are electrically insulating.

16. The current limiter as claimed in claim 1, further comprising a cooling device comprising the cooling fluid in contact with the electrically insulating spacers (8), between turns of the coil (2), and with the electrically conductive spacers (9), between the superconducting cables (5).

17. The current limiter as claimed in claim 1, wherein the conductive spacer (12) has soles (20) or bases (21) that increase a contact area with the two superconducting cables (5).

18. The current limiter as claimed in claim 1, wherein the conductive spacer (12) has additional heat exchangers (22) for exchanging heat with the cooling fluid.

* * * * *